United States Patent
Huang (10) Patent No.: US 8,916,879 B2
(45) Date of Patent: Dec. 23, 2014

(54) PIXEL UNIT AND PIXEL ARRAY

(71) Applicant: AU Optronics Corp., Hsin-Chu (TW)

(72) Inventor: Chih-Hsuan Huang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/969,618

(22) Filed: Aug. 19, 2013

(65) Prior Publication Data

US 2014/0209932 A1    Jul. 31, 2014

(30) Foreign Application Priority Data

Jan. 30, 2013   (TW) .............................. 102103508 A (51) Int. Cl.
*H01L 27/32* (2006.01)
*H01L 27/12* (2006.01)

(52) U.S. Cl.
CPC ................................... *H01L 27/124* (2013.01)
USPC ............................................. 257/59; 257/72

(58) Field of Classification Search
CPC .............. H01L 27/124; H01L 27/1233; H01L 27/3211; H01L 27/3213; H01L 27/3276; H01L 27/3244
USPC .................................................... 257/59, 72
See application file for complete search history.

(56) References Cited

U.S. PATENT DOCUMENTS

| 7,796,106 | B2 | 9/2010 | Ha | |
|---|---|---|---|---|
| 8,102,489 | B2* | 1/2012 | Kim | 349/110 |
| 8,405,803 | B2* | 3/2013 | Kim et al. | 349/109 |
| 2004/0211961 | A1* | 10/2004 | Koo et al. | 257/59 |
| 2005/0117102 | A1* | 6/2005 | Park et al. | 349/141 |
| 2007/0019124 | A1* | 1/2007 | Kim | 349/43 |
| 2008/0225194 | A1* | 9/2008 | Harada et al. | 349/46 |
| 2009/0309903 | A1* | 12/2009 | Park et al. | 345/690 |
| 2011/0037688 | A1* | 2/2011 | Chiang et al. | 345/98 |
| 2012/0176051 | A1* | 7/2012 | Takatori | 315/192 |
| 2012/0249496 | A1* | 10/2012 | Pai | 345/204 |
| 2013/0241974 | A1* | 9/2013 | Teranishi | 345/691 |

FOREIGN PATENT DOCUMENTS

| CN | 101526710 | 9/2009 |
|---|---|---|
| CN | 101718931 | 6/2010 |

\* cited by examiner

*Primary Examiner* — Michael Lebentritt
(74) *Attorney, Agent, or Firm* — Winston Hsu; Scott Margo (57) ABSTRACT

A pixel array and a pixel unit thereof adapted in a display panel are provided. The pixel array includes a plurality of pixel units, and each pixel unit includes a first gate line, a second gate line, a data line, a first sub-pixel, a second sub-pixel and a third sub-pixel. The first sub-pixel is electrically connected to the second gate line and electrically connected to the data line through the third sub-pixel. The second sub-pixel is electrically connected to the second gate line and the data line. The third sub-pixel is electrically connected to the first gate line and the data line.

20 Claims, 8 Drawing Sheets

PIXEL UNIT AND PIXEL ARRAY

BACKGROUND OF THE INVENTION

1. Field of the Invention

The present disclosure relates to a pixel array and a pixel unit, and more particularly, to a pixel array and a pixel unit employing only two gate lines and one data line to drive three sub-pixels.

2. Description of the Prior Art

Generally, a pixel unit of a display panel includes three sub-pixels to display images of different colors, such as a red sub-pixel, a green sub-pixel and a blue sub-pixel. In the conventional display panel, a gate line and a data line are both necessary for a sub-pixel to be driven. In other words, the red sub-pixel, the green sub-pixel and the blue sub-pixel of a display pixel unit must be driven with at least four signal lines (e.g., one gate line and three data lines, or three gate lines and one data line). If the number of the signal lines is too large, the cost of driver chip increases and the aperture ratio can hardly rise.

SUMMARY OF THE INVENTION

It is one of the objectives of the disclosure to provide a pixel array and a pixel unit, thereby reducing the number of signal lines of the pixel array and the pixel unit, and then reducing the cost of driver chip and raising the aperture ratio.

An embodiment of the disclosure provides a pixel unit. The pixel unit is adapted to a display panel. The pixel unit includes a first gate line, a second gate line, a data line, a first sub-pixel, a second sub-pixel and a third sub-pixel. The first sub-pixel includes a first pixel electrode and a first active switching device. The first active switching device includes a first gate electrode, a first source electrode and a first drain electrode. The first gate electrode is electrically connected to the second gate line. The first drain electrode is electrically connected to the first pixel electrode. The second sub-pixel includes a second pixel electrode and a second active switching device. The second active switching device includes a second gate electrode, a second source electrode and a second drain electrode. The second gate electrode is electrically connected to the second gate line. The second source electrode is electrically connected to the data line. The second drain electrode is electrically connected to the second pixel electrode. The third sub-pixel includes a third pixel electrode and a third active switching device. The third active switching device includes a third gate electrode, a third source electrode and a third drain electrode. The third gate electrode is electrically connected to the first gate line. The third source electrode is electrically connected to the data line. The third drain electrode is electrically connected to the third pixel electrode and the first source electrode respectively.

Another embodiment of the disclosure provides a pixel array. The pixel array is adapted to a display panel. The pixel array includes a plurality of first gate lines, a plurality of second gate lines, a data line, a plurality of first sub-pixels, a plurality of second sub-pixels and a plurality of third sub-pixels. The first gate lines and the second gate lines are alternately arranged in sequence. The data line intersects the first gate lines and the second gate lines. The first sub-pixels, the second sub-pixels and the third sub-pixels are arranged and constitute a plurality of row sub-pixels. Each of the row sub-pixels includes a first sub-pixel, a second sub-pixel and a third sub-pixel. Each of the first sub-pixels includes a first pixel electrode and a first active switching device. The first active switching device includes a first gate electrode, a first source electrode and a first drain electrode. The first gate electrode is electrically connected to the corresponding second gate line. The first drain electrode is electrically connected to the first pixel electrode. Each of the second sub-pixels includes a second pixel electrode and a second active switching device. The second active switching device includes a second gate electrode, a second source electrode and a second drain electrode. The second gate electrode is electrically connected to the corresponding second gate line. The second source electrode is electrically connected to the data line. The second drain electrode is electrically connected to the second pixel electrode. Each of the third sub-pixels includes a third pixel electrode and a third active switching device. The third active switching device includes a third gate electrode, a third source electrode and a third drain electrode. The third gate electrode is electrically connected to the corresponding first gate line. The third source electrode is electrically connected to the data line. The third drain electrode is electrically connected to the third pixel electrode and the first source electrode corresponding to the third drain electrode. The first gate electrode of the first sub-pixel located in an (n+1)-th row of the row sub-pixels is electrically connected to an m-th of the second gate lines. The second gate electrode of the second sub-pixel located in the (n+1)-th row of the row sub-pixels is electrically connected to the m-th of the second gate lines. The third gate electrode of the third sub-pixel located in an n-th row of the row sub-pixels is electrically connected to an m-th of the first gate lines. The third drain electrode of the third sub-pixel located in the n-th row of the row sub-pixels is electrically connected to the first source electrode of the first sub-pixel located in the (n+1)-th row of the row sub-pixels. The third gate electrode of the third sub-pixel located in the (n+1)-th row of the row sub-pixels is electrically connected to an (m+1)-th of the first gate lines.

In the pixel arrays and the pixel units of the present disclosure, the first sub-pixel, the second sub-pixel and the third sub-pixel are driven with simply three signal lines (i.e., two gate lines and one data line). As a result, the cost of driver chip is significantly reduced, the aperture ratio rises and display quality is further improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements. In addition, the terms such as "first" and "second" described in the present disclosure are used to distinguish different components or processes, which do not limit the sequence of the components or processes.

Figure 1:
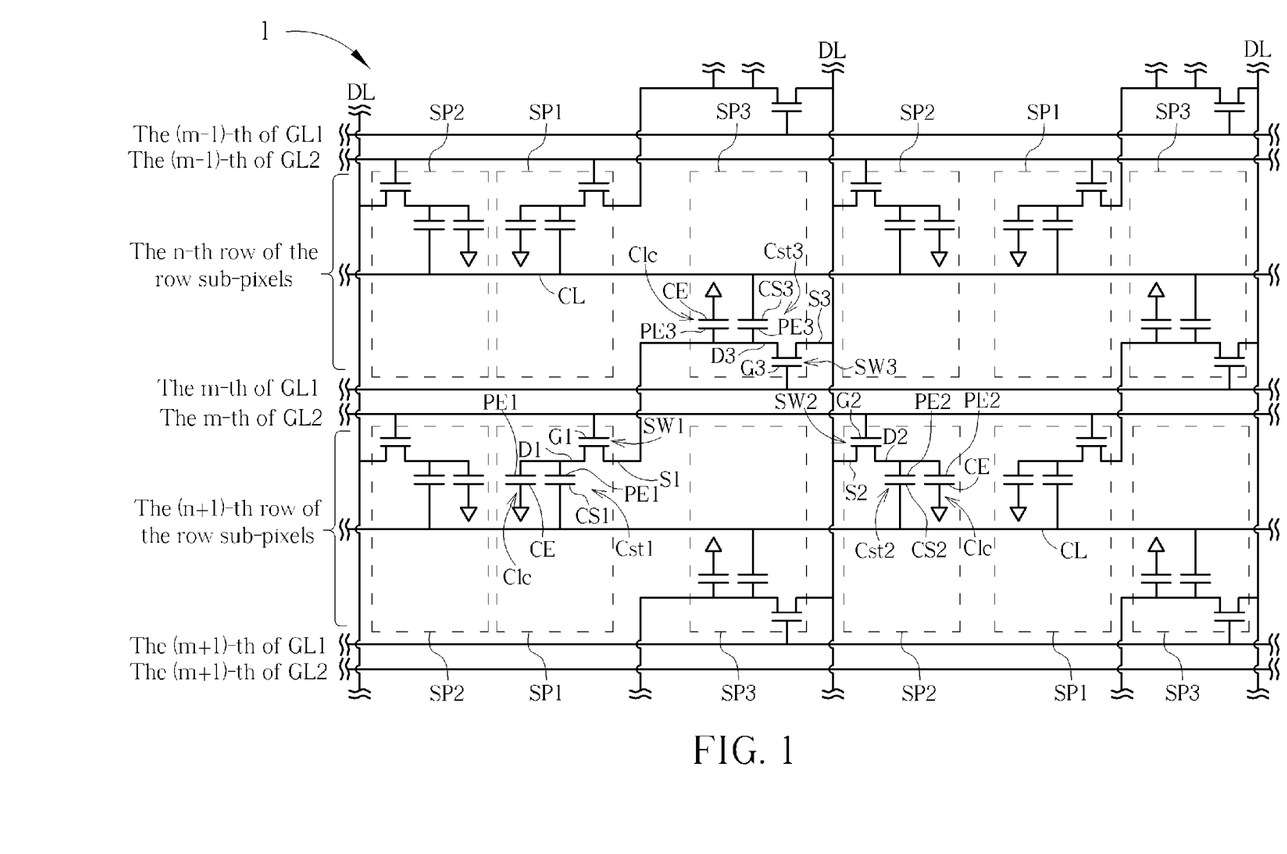
FIG. 1 is an equivalent circuit diagram of a pixel array according to a first embodiment of the present disclosure.
Figure 2:
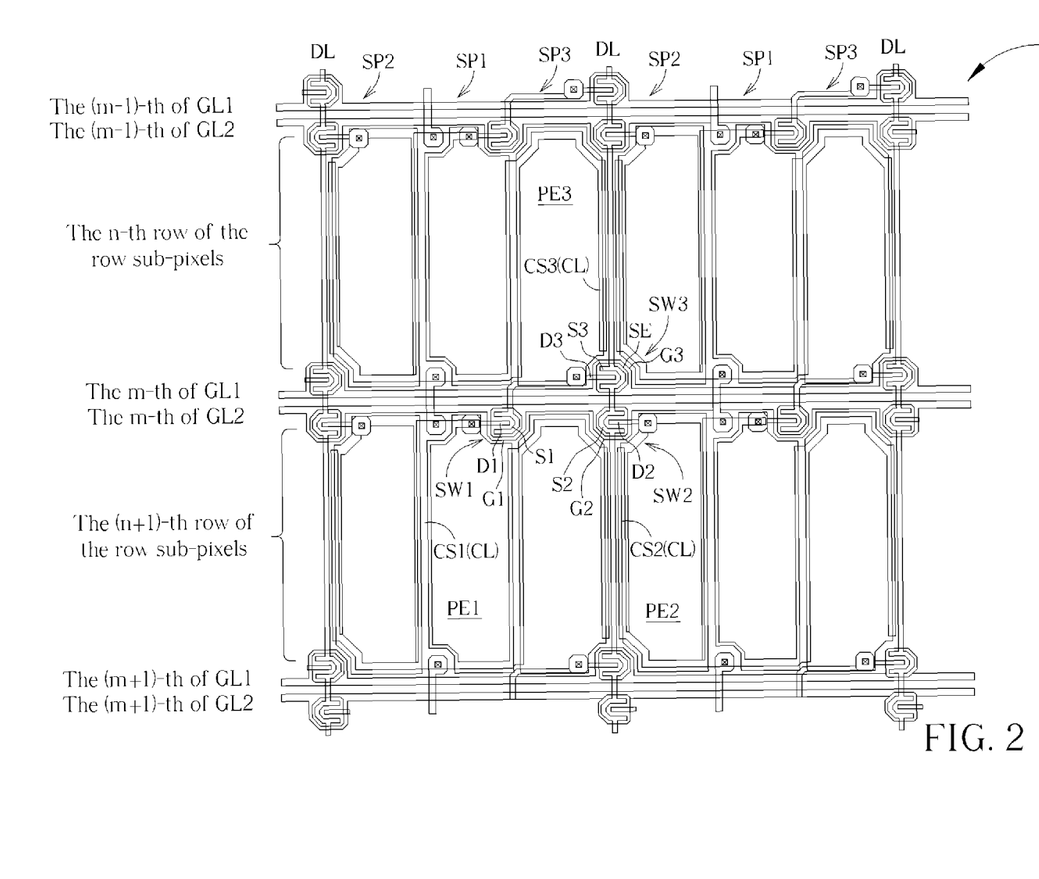
FIG. 2 is a schematic diagram illustrating a structure of the pixel array according to the first embodiment of the present disclosure.

Please refer to FIGS. 1-2. FIG. 1 is an equivalent circuit diagram of a pixel array according to a first embodiment of the present disclosure. FIG. 2 is a schematic diagram illustrating a structure of the pixel array according to the first embodiment of the present disclosure. The pixel array of this embodiment is suitable for all kinds of the display panels, and the pixel array of this embodiment is exemplarily embodied as the pixel array of a liquid crystal display panel, but not limited thereto. As shown in FIGS. 1-2, the pixel array 1 in this embodiment includes a plurality of first gate lines GL1 (e.g., the (m−1)-th of the first gate lines GL1, the m-th of the first gate lines GL1 and the (m+1)-th of the first gate lines GL1), a plurality of second gate lines GL2 (e.g., the (m−1)-th of the second gate lines GL2, the m-th of the second gate lines GL2 and the (m+1)-th of the second gate lines GL2), a plurality of data lines DL, a plurality of first sub-pixels SP1, a plurality of second sub-pixels SP2 and a plurality of third sub-pixels SP3. The first gate lines GL1 and the second gate lines GL2 are alternately arranged in sequence. The data lines DL intersect the first gate lines GL1 and the second gate lines GL2. In this embodiment, the first gate lines GL1 and the second gate lines GL2 are substantially disposed parallel to one another. The data lines DL are substantially disposed perpendicular to the first gate lines GL1 and the second gate lines GL2. The first gate lines GL1 and the second gate lines GL2 may be formed from the same patterned conductive layer, such as a first metal layer. The data lines DL may be formed from another patterned conductive layer, such as a second metal layer, but not limited thereto. Each of the first gate lines GL1 and the adjacent second gate line GL2 are closely disposed without any sub-pixel in-between. For example, the (m−1)-th of the first gate lines GL1 and the (m−1)-th of the second gate lines GL2 are closely disposed. The m-th of the first gate lines GL1 and the m-th of the second gate lines GL2 are closely disposed. The (m+1)-th of the first gate lines GL1 and the (m+1)-th of the second gate lines GL2 are closely disposed and so on. Moreover, the first sub-pixel SP1 and the second sub-pixel SP2 are disposed in the same side of the second gate line GL2 (the lower side of the figures). The first gate line GL1 and the second gate line GL2 are disposed between the third sub-pixel SP3 and the first sub-pixel SP1 and between the third sub-pixel SP3 and the second sub-pixel SP2—that is to say, the third sub-pixel SP3 is disposed in the other side of the first gate line GL1 relative to the second gate line GL2 (the upper side of the figures). The first sub-pixel SP1, the second sub-pixel SP2 and the third sub-pixel SP3 substantially have the same shape, such as an almost rectangle, but not limited thereto. In this embodiment, the first sub-pixel SP1 and the third sub-pixel SP3 are disposed in the first side of the data line DL (the left side of the figures). The second sub-pixel SP2 is disposed in the second side of the data line DL (the right side of the figures). A third sub-pixel SP3 of another pixel unit adjacent to both the first sub-pixel SP1 and the data line DL is disposed between the first sub-pixel SP1 and the data line DL, but not limited thereto.

Each of the first sub-pixels SP1 includes a first pixel electrode PE1 and a first active switching device SW1. The first active switching device SW1 includes a first gate electrode G1, a first source electrode S1 and a first drain electrode D1. The first gate electrode G1 is electrically connected to the corresponding second gate line GL2. The first drain electrode D1 is electrically connected to the first pixel electrode PE1. Each of the second sub-pixels SP2 includes a second pixel electrode PE2 and a second active switching device SW2. The second active switching device SW2 includes a second gate electrode G2, a second source electrode S2 and a second drain electrode D2. The second gate electrode G2 is electrically connected to the corresponding second gate line GL2. The second source electrode S2 is electrically connected to the data line DL. The second drain electrode D2 is electrically connected to the second pixel electrode PE2. Each of the third sub-pixels SP3 includes a third pixel electrode PE3 and a third active switching device SW3. The third active switching device SW3 includes a third gate electrode G3, a third source electrode S3 and a third drain electrode D3. The third gate electrode G3 is electrically connected to the corresponding first gate line GL1. The third source electrode S3 is electrically connected to the data line DL. The third drain electrode D3 is electrically connected to the third pixel electrode PE3 and the corresponding first source electrode S1. The first pixel electrode PE1, the second pixel electrode PE2 and the third pixel electrode PE3 may include transparent electrodes, such as indium tin oxide electrodes or indium zinc oxide electrodes, but not limited thereto. The first active switching device SW1, the second active switching device SW2 and the third active switching device SW3 may include thin film transistor devices, and may further include the semiconductor layers SE and gate insulation layers (not shown). In this embodiment, the thin film transistor devices may be bottom gate thin film transistor devices, but not limited thereto. For example, the thin film transistor devices may be top gate thin film transistor devices.

The pixel array 1 of this embodiment may further include a common electrode CE, a first patterned storage electrode CS1, a second patterned storage electrode CS2 and a third patterned storage electrode CS3. The common electrode CE has a common voltage. The common electrode CE, the first pixel electrode PE1, the second pixel electrode PE2 and the third pixel electrode PE3 may respectively constitute liquid crystal capacitors Clc. The first patterned storage electrode CS 1, the second patterned storage electrode CS2 and the third patterned storage electrode CS3 may be connected to a storage electrode line CL. The first patterned storage electrode CS1, the second patterned storage electrode CS2, the third patterned storage electrode CS3 and the storage electrode lines CL, the first gate lines GL1 and the second gate lines GL2 may be formed from the same patterned conductive layer. The first patterned storage electrode CS1 substantially surrounds the first sub-pixel SP1. The first patterned storage electrode CS1 and the first pixel electrode PE1 constitute a first storage capacitor Cst1. The second patterned storage electrode CS2 substantially surrounds the second sub-pixel SP2. The second patterned storage electrode CS2 and the second pixel electrode PE2 constitute a second storage capacitor Cst2. The third patterned storage electrode CS3 substantially surrounds the third sub-pixel SP3. The third patterned storage electrode CS3 and the third pixel electrode PE3 constitute a third storage capacitor Cst3. The aforementioned patterned storage electrodes may not necessarily surround the sub-pixels and may be other shapes according to the requirements of storage capacitance.

The first sub-pixel SP1, the second sub-pixel SP2 and the third sub-pixel SP3 substantially have the same area. The first sub-pixel SP1, the second sub-pixel SP2 and the third sub-pixel SP3 are set to display images of different colors respectively. For example, the first sub-pixel SP1, the second sub-pixel SP2 and the third sub-pixel SP3 may be respectively a blue sub-pixel, a green sub-pixel and a red sub-pixel, but not limited thereto. The first sub-pixel SP1, the second sub-pixel SP2 and the third sub-pixel SP3 are disposed between the first gate line GL1 and the second gate line GL2, which are adjacent to each other but not closely disposed. In other words, the first sub-pixel SP1, the second sub-pixel SP2 and the third sub-pixel SP3 are arranged and constitute a plurality of row sub-pixels, such as the n-th row of the row sub-pixels and the (n+1)-th row of the row sub-pixels. The first gate electrode G1 of the first sub-pixel SP1 located in the (n+1)-th row of the row sub-pixels is electrically connected to the m-th of the second gate lines GL2. The second gate electrode G2 of the second sub-pixel SP2 located in the (n+1)-th row of the row sub-pixels is electrically connected to the m-th of the second gate lines GL2. The third gate electrode G3 of the third sub-pixel SP3 located in the n-th row of the row sub-pixels is electrically connected to the m-th of the first gate lines GL1. The third drain electrode D3 of the third sub-pixel SP3 located in the n-th row of the row sub-pixels is electrically connected to the first source electrode S1 of the first sub-pixel SP1 located in the (n+1)-th row of the row sub-pixels. The third gate electrode G3 of the third sub-pixel SP3 located in the (n+1)-th row of the row sub-pixels is electrically connected to the (m+1)-th of the first gate lines GL1.

Figure 3:
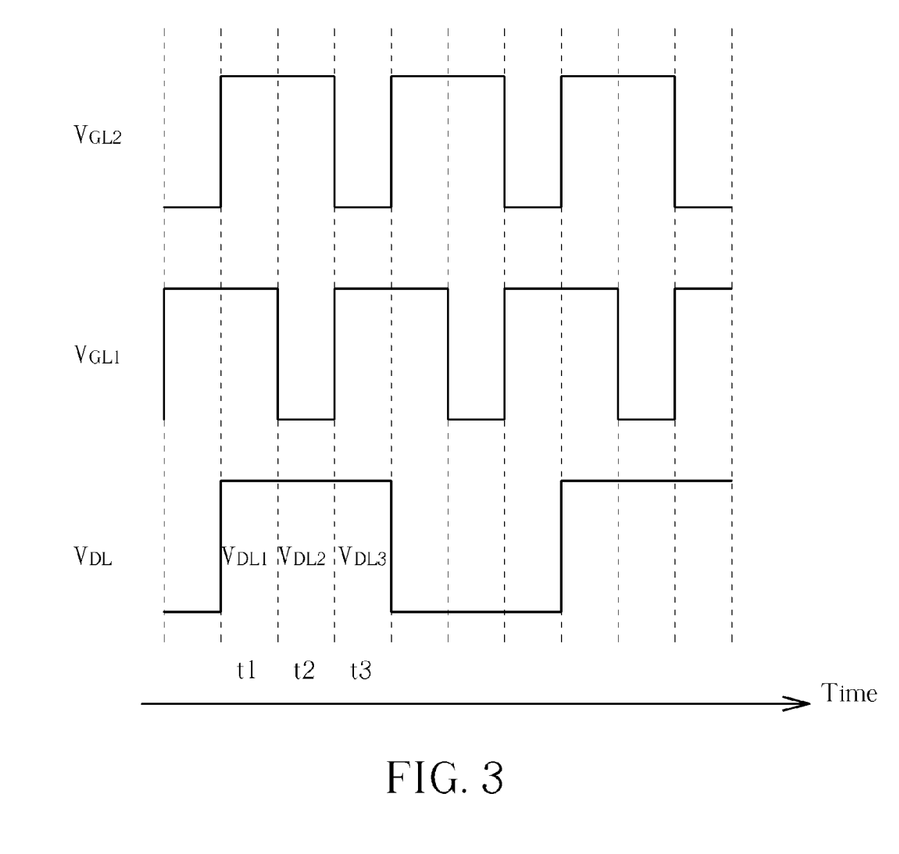
FIG. 3 is a timing schematic diagram illustrating the driving signals of the pixel array in the present disclosure.

Please refer to FIG. 3, and also refer to FIG. 1. FIG. 3 is a timing schematic diagram illustrating the driving signals of the pixel array in the present disclosure. As shown in FIG. 1 and FIG. 3, the first gate lines GL1 are configured to provide first gate signals $V_{GL1}$. The second gate lines GL2 are configured to provide second gate signals $V_{GL2}$. The data lines are configured to provide data signals $V_{DL}$. In different periods, the data signals $V_{DL}$ includes a first data signals $V_{DL1}$, a second data signals $V_{DL2}$ and a third data signals $V_{DL3}$. In the first period t1, the first gate signals $V_{GL1}$ has an "on" level and the second gate signals $V_{GL2}$ has an "on" level. At this moment, the first active switching device SW1, the second active switching device SW2 and the third active switching device SW3 are in an on state so that the first data signals $V_{DL1}$ are delivered to the first sub-pixel SP1 through the third active switching device SW3 and the first active switching device SW1 sequentially. In the second period t2, the first gate signals $V_{GL1}$ has an "off" level and the second gate signals $V_{GL2}$ has an "on" level. At this moment, the first active switching device SW1 and the second active switching device SW2 are in an on state while the third active switching device SW3 is in an off state so that the second data signals $V_{DL2}$ are delivered to the second sub-pixel SP2 through the second active switching device SW2. In the third period t3, the first gate signals $V_{GL1}$ has an "on" level and the second gate signals $V_{GL2}$ has an "off" level. At this moment, the first active switching device SW1 and the second active switching device SW2 are in an off state while the third active switching device SW3 is in an on state so that the third data signals $V_{DL3}$ are delivered to the third sub-pixel SP3 through the third active switching device SW3.

Figure 4:
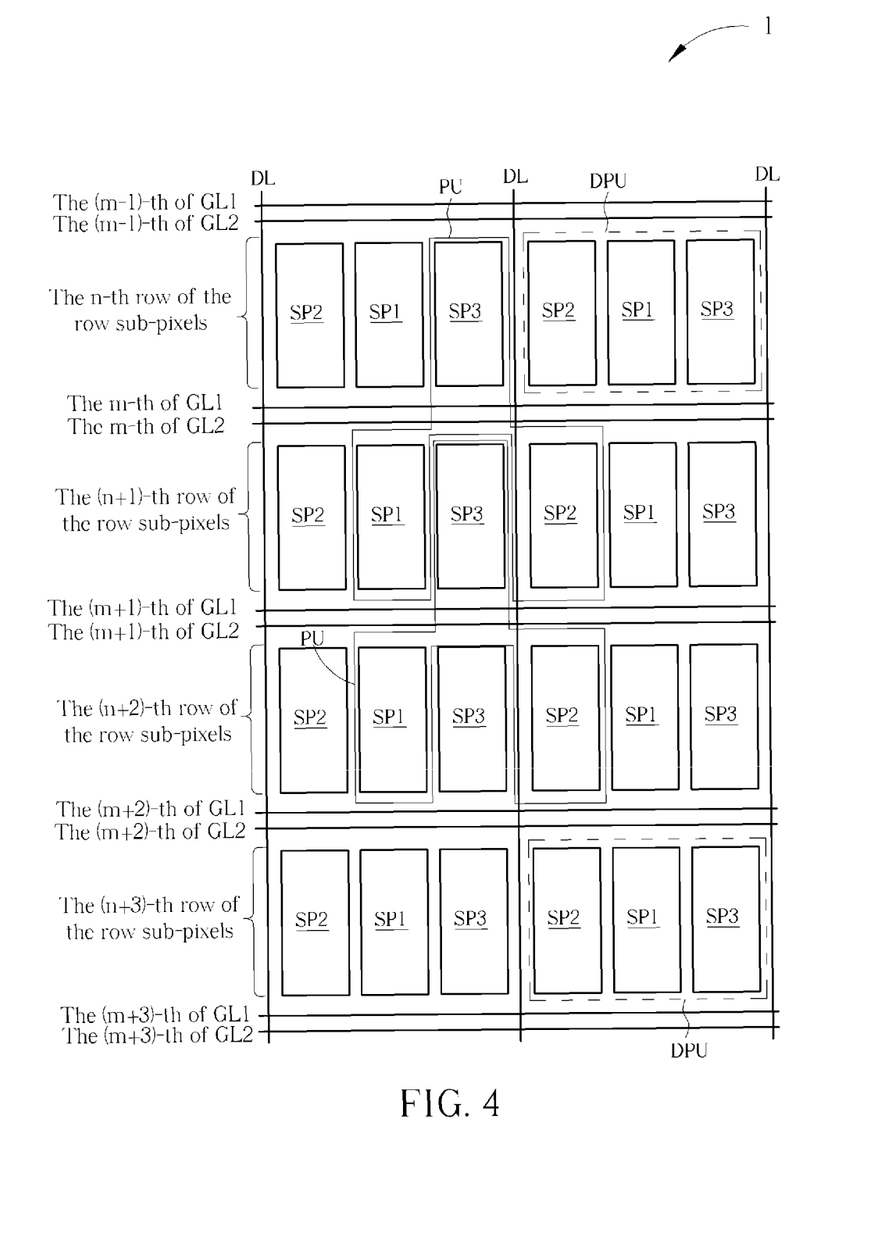
FIG. 4 is a schematic diagram illustrating the pixel array according to the first embodiment of the present disclosure.

Please refer to FIG. 4 and also refer to FIGS. 1-2. FIG. 4 is a schematic diagram illustrating the pixel array according to the first embodiment of the present disclosure. As shown in FIG. 4, in this embodiment, the first sub-pixel SP1 and the second sub-pixel SP2 which locate in the same row but in the two opposite sides of the data line DL and the third sub-pixel SP3 which locates in the adjacent row and in the same side of the data line DL as the first sub-pixel SP1 constitute the pixel unit PU of this embodiment. The pixel unit PU is a driving pixel unit. For example, both the first sub-pixel SP1 and the second sub-pixel SP2 located in the (n+1)-th row of the row sub-pixels and the third sub-pixel SP3 located in the n-th row of the row sub-pixels constitute a pixel unit PU. In other words, the three sub-pixels mentioned above are driven by the m-th of the first gate lines GL1, the m-th of the second gate lines GL2 and the same data line DL. Similarly, the first sub-pixel SP1 and the second sub-pixel SP2 located in the (n+2)-th row of the row sub-pixels and the third sub-pixel SP3 located in the (n+1)-th row of the row sub-pixels constitute a pixel unit PU. The three sub-pixels mentioned above are driven by the (m+1)-th of the first gate lines GL1, the (m+1)-th of the second gate lines GL2 and the same data line DL. The first sub-pixel SP1 and the second sub-pixel SP2 located in the (n+3)-th row of the row sub-pixels and the third sub-pixel SP3 located in the (n+2)-th row of the row sub-pixels constitute a pixel unit PU. The three sub-pixels mentioned above are driven by the (m+2)-th of the first gate lines GL1, the (m+2)-th of the second gate lines GL2 and the same data line DL and so on. Moreover, the first sub-pixel SP1, the second sub-pixel SP2 and the third sub-pixel SP3 of the pixel unit PU may also simultaneously provide images of different colors and constitute a display pixel unit to display a full color image, but not limited thereto. For example, the first sub-pixel SP1, the second sub-pixel SP2 and the third sub-pixel SP3 arranged in the same row sub-pixel constitute a display pixel unit DPU—that is to say, the first sub-pixel SP1, the second sub-pixel SP2 and the third sub-pixel SP3 arranged in the same row and adjacent to one another individually provide images of different colors and subsequently constitute a full color image. Because the first sub-pixel SP1, the second sub-pixel SP2 and the third sub-pixel SP3 arranged in the same row and adjacent to one another are closely disposed, the display performance is higher.

Accordingly, in the pixel array of this embodiment, the three sub-pixels of one pixel unit are driven with simply three signal lines (i.e., two gate lines and one data line). On the other hand, the three sub-pixels of one pixel unit in the conventional pixel array must be driven with at least four signal lines (e.g., one gate line and three data lines, or three gate lines and one data line). As a result, the pixel array of the present disclosure reduces a quarter of signal lines, significantly reduces the cost of driver chip, raises the aperture ratio and thus improves display quality.

Pixel arrays and pixel units are not restricted to the preceding embodiments in the present disclosure. Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 5:
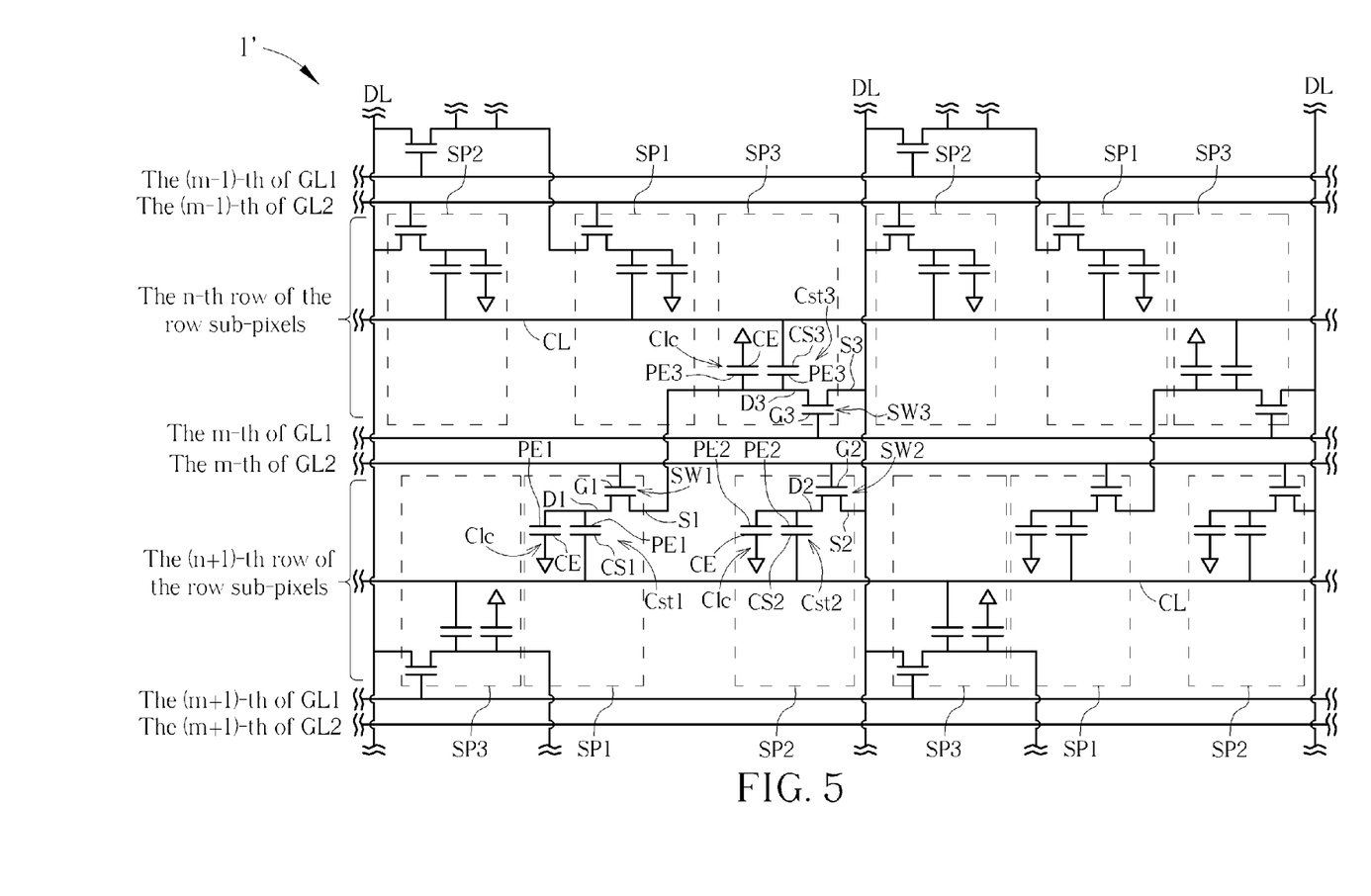
FIG. 5 is an equivalent circuit diagram of a pixel array according to a variant embodiment of the first embodiment of the present disclosure.
Figure 6:
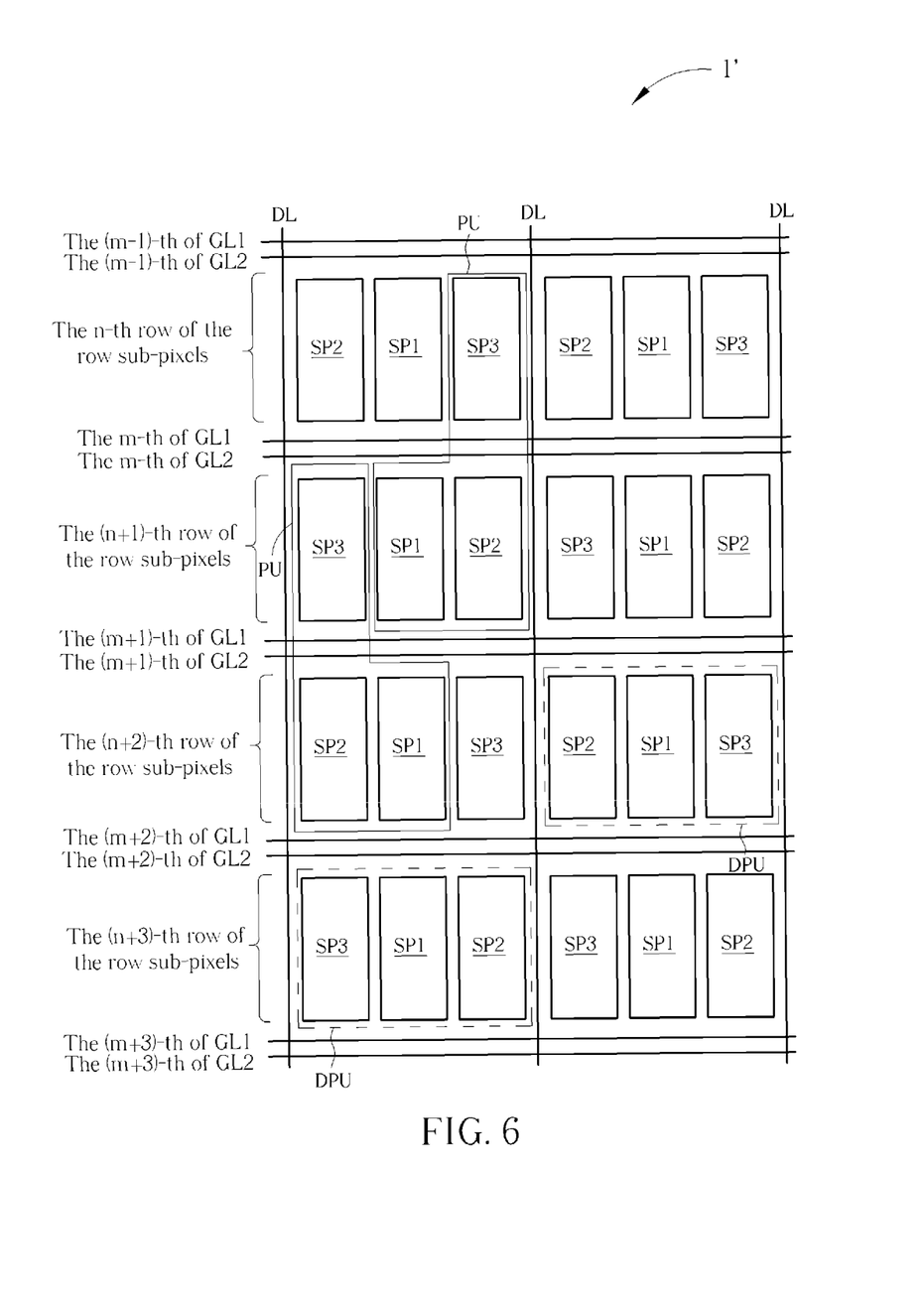
FIG. 6 is a schematic diagram illustrating the pixel array according to the variant embodiment of the first embodiment of the present disclosure.

Please refer to FIGS. 5-6. FIG. 5 is an equivalent circuit diagram of a pixel array according to a variant embodiment of the first embodiment of the present disclosure. FIG. 6 is a schematic diagram illustrating the pixel array according to the variant embodiment of the first embodiment of the present disclosure. As shown in FIGS. 5-6, in the pixel array 1' of this variant embodiment, the first sub-pixel SP1 and the second sub-pixel SP2 are disposed in the same side of the second gate line GL2 (the lower side of the figures). The first gate line GL1 and the second gate line GL2 are disposed between the third sub-pixel SP3 and the first sub-pixel SP1 and between the third sub-pixel SP3 and the second sub-pixel SP2—that is to say, the third sub-pixel SP3 is disposed in the other side of the first gate line GL1 relative to the second gate line GL2 (the upper side of the figures). The first sub-pixel SP1, the second sub-pixel SP2 and the third sub-pixel SP3 substantially have the same shape, such as an almost rectangle, but not limited thereto. Compared with the first embodiment, the first sub-pixel SP1, the second sub-pixel SP2 and the third sub-pixel SP3 are disposed in the first side of the data line DL (the left side of the figures) in this embodiment. The first sub-pixel SP1 and the second sub-pixel SP2 are driven by the second gate line GL2 and the data line DL. The third sub-pixel SP3 are driven by the first gate line GL1 and the data line DL. In other words, the first sub-pixel SP1, the second sub-pixel SP2 and the third sub-pixel SP3 of the pixel array 1' in this variant embodiment may be connected to the first gate line GL1, the second gate line GL2 and the data line DL by the aforementioned connection method. Moreover, the first sub-pixel SP1, the second sub-pixel SP2 and the third sub-pixel SP3 are driven with simply three signal lines (i.e., two gate lines and one data line) by the aforementioned driving method. The first sub-pixel SP1 and the second sub-pixel SP2 which locate in the same row and in the same side of the data line DL and the third sub-pixel SP3 which locates in the adjacent row and in the same side of the data line DL as the first sub-pixel SP1 and the second sub-pixel SP2 constitute the pixel unit PU of this embodiment. The pixel unit PU is a driving pixel unit. For example, both the first sub-pixel SP 1 and the second sub-pixel SP2 located in the (n+1)-th row of the row sub-pixels and the third sub-pixel SP3 located in the n-th row of the row sub-pixels constitute the pixel unit PU of this embodiment. In other words, the three sub-pixels mentioned above are driven by the m-th of the first gate lines GL1, the m-th of the second gate lines GL2 and the same data line DL. Similarly, the first sub-pixel SP1 and the second sub-pixel SP2 located in the (n+2)-th row of the row sub-pixels and the third sub-pixel SP3 located in the (n+1)-th row of the row sub-pixels constitute a pixel unit PU. The three sub-pixels mentioned above are driven by the (m+1)-th of the first gate lines GL1, the (m+1)-th of the second gate lines GL2 and the same data line DL. The first sub-pixel SP1 and the second sub-pixel SP2 located in the (n+3)-th row of the row sub-pixels and the third sub-pixel SP3 located in the (n+2)-th row of the row sub-pixels constitute a pixel unit PU. The three sub-pixels mentioned above are driven by the (m+2)-th of the first gate lines GL1, the (m+2)-th of the second gate lines GL2 and the same data line DL and so on. Moreover, the first sub-pixel SP1, the second sub-pixel SP2 and the third sub-pixel SP3 of the pixel unit PU may simultaneously provide images of different colors and constitute a display pixel unit to display a full color image, but not limited thereto. For example, the first sub-pixel SP1, the second sub-pixel SP2 and the third sub-pixel SP3 arranged in the same row sub-pixel constitute a display pixel unit DPU— that is to say, the first sub-pixel SP1, the second sub-pixel SP2 and the third sub-pixel SP3 arranged in the same row and adjacent to one another individually provide images of different colors and subsequently constitute a full color image.

Figure 7:
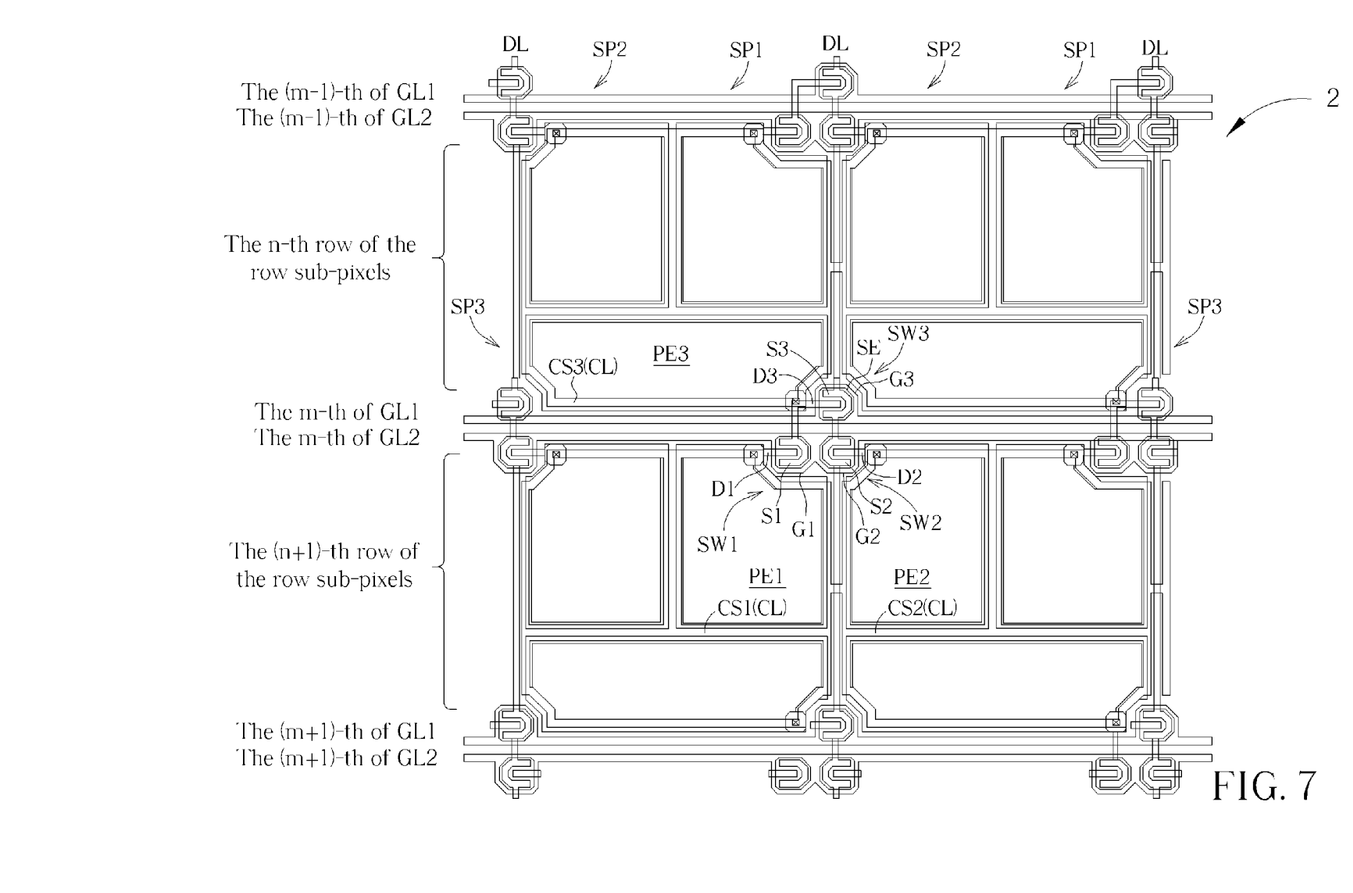
FIG. 7 is a schematic diagram illustrating a pixel array according to a second embodiment of the present disclosure.
Figure 8:
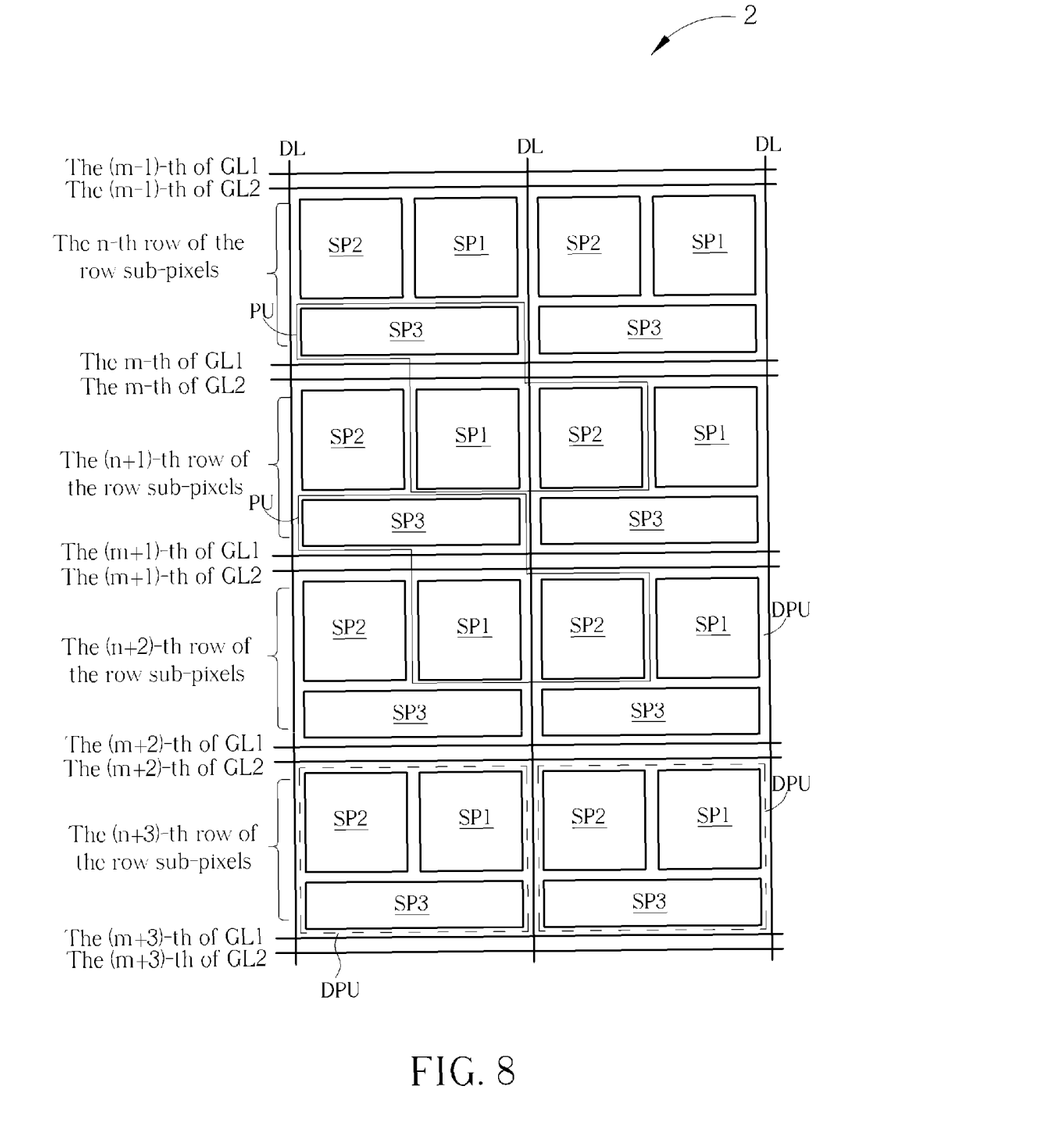
FIG. 8 is a schematic diagram illustrating the pixel array according to the second embodiment of the present disclosure.

Please refer to FIGS. 7-8. FIG. 7 is a schematic diagram illustrating a pixel array according to a second embodiment of the present disclosure. FIG. 8 is a schematic diagram illustrating the pixel array according to the second embodiment of the present disclosure. As shown in FIGS. 7-8, in the pixel array 2 of the second embodiment, the first sub-pixel SP1 and the second sub-pixel SP2 are disposed in the same side of the second gate line GL2 (the lower side of the figures). The first gate line GL1 and the second gate line GL2 are disposed between the third sub-pixel SP3 and the first sub-pixel SP1 and between the third sub-pixel SP3 and the second sub-pixel SP2. Moreover, the first sub-pixel SP1 and the data line DL are closely disposed—that is to say, there is no sub-pixel between the first sub-pixel SP1 and the data line DL. The first sub-pixel SP1 and the second sub-pixel SP2 substantially have the same shape, such as an almost square, while the third sub-pixel SP3 substantially has a shape, such as an almost rectangle, different from that of the first sub-pixel SP1 and the second sub-pixel SP2. Similarly, the first sub-pixel SP1, the second sub-pixel SP2 and the third sub-pixel SP3 of the pixel array 2 in the second embodiment may be connected to the first gate line GL1, the second gate line GL2 and the data line DL by the connection method of the first embodiment. Moreover, the first sub-pixel SP1, the second sub-pixel SP2 and the third sub-pixel SP3 are driven with simply three signal lines (i.e., two gate lines and one data line) by the aforementioned driving method. The first sub-pixel SP1 and the second sub-pixel SP2 which locate in the same row and in the two opposite sides of the data line DL and the third sub-pixel SP3 which locates in the adjacent row and in the same side of the data line DL as the first sub-pixel SP1 constitute the pixel unit PU of this embodiment. The pixel unit PU is a driving pixel unit. For example, both the first sub-pixel SP1 and the second sub-pixel SP2 located in the (n+1)-th row of the row sub-pixels and the third sub-pixel SP3 located in the n-th row of the row sub-pixels constitute the pixel unit PU. In other words, the three sub-pixels mentioned above are driven by the m-th of the first gate lines GL1, the m-th of the second gate lines GL2 and the same data line DL. Similarly, the first sub-pixel SP1 and the second sub-pixel SP2 located in the (n+2)-th row of the row sub-pixels and the third sub-pixel SP3 located in the (n+1)-th row of the row sub-pixels constitute a pixel unit PU. The three sub-pixels mentioned above are driven by the (m+1)-th of the first gate lines GL1, the (m+1)-th of the second gate lines GL2 and the same data line DL. The first sub-pixel SP1 and the second sub-pixel SP2 located in the (n+3)-th row of the row sub-pixels and the third sub-pixel SP3 located in the (n+2)-th row of the row sub-pixels constitute a pixel unit PU. The three sub-pixels mentioned above are driven by the (m+2)-th of the first gate lines GL1, the (m+2)-th of the second gate lines GL2 and the same data line DL and so on. Moreover, the first sub-pixel SP1, the second sub-pixel SP2 and the third sub-pixel SP3 of the pixel unit PU may simultaneously provide images of different colors and constitute a display pixel unit to display a full color image, but not limited thereto. For example, the first sub-pixel SP1, the second sub-pixel SP2 and the third sub-pixel SP3 arranged in the same row sub-pixel constitute a display pixel unit DPU— that is to say, the first sub-pixel SP1, the second sub-pixel SP2 and the third sub-pixel SP3 arranged in the same row and adjacent to one another individually provide images of different colors and subsequently constitute a full color image.

To sum up, in the pixel arrays and the pixel units of the present disclosure, the three sub-pixels are driven with simply three signal lines (i.e., two gate lines and one data line). As a result, the cost of driver chip is significantly reduced, the aperture ratio rises and display quality is further improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel unit, adapted to a display panel, the pixel unit comprising:
   a first gate line;
   a second gate line;
   a data line;
   a first sub-pixel, comprising:
      a first pixel electrode; and
      a first active switching device, comprising a first gate electrode, a first source electrode and a first drain electrode, wherein the first gate electrode is electrically connected to the second gate line, and the first drain electrode is electrically connected to the first pixel electrode;
   a second sub-pixel, comprising:
      a second pixel electrode; and
      a second active switching device, comprising a second gate electrode, a second source electrode and a second drain electrode, wherein the second gate electrode is electrically connected to the second gate line, the second source electrode is electrically connected to the data line, and the second drain electrode is electrically connected to the second pixel electrode; and
   a third sub-pixel, comprising:
      a third pixel electrode; and
      a third active switching device, comprising a third gate electrode, a third source electrode and a third drain electrode, wherein the third gate electrode is electrically connected to the first gate line, the third source electrode is electrically connected to the data line, and the third drain electrode is electrically connected to the third pixel electrode and the first source electrode respectively.

2. The pixel unit according to claim 1, wherein the first sub-pixel, the second sub-pixel and the third sub-pixel substantially have a same area.

3. The pixel unit according to claim 1, wherein the first gate line is configured to provide a first gate signal, the second gate line is configured to provide a second gate signal, the data line is configured to provide a data signal, and the data signal comprises a first data signal, a second data signal and a third data signal.

4. The pixel unit according to claim 3, wherein
   in a first period, the first gate signal has an "on" level and the second gate signal has an "on" level so that the first data signal is delivered to the first sub-pixel;
   in a second period, the first gate signal has an "off" level and the second gate signal has an "on" level so that the second data signal is delivered to the second sub-pixel; and
   in a third period, the first gate signal has an "on" level and the second gate signal has an "off" level so that the third data signal is delivered to the third sub-pixel.

5. The pixel unit according to claim 1, wherein both the first sub-pixel and the second sub-pixel are disposed in a same side of the second gate line, and both the first gate line and the second gate line are disposed between the third sub-pixel and the first sub-pixel and between the third sub-pixel and the second sub-pixel.

6. The pixel unit according to claim 5, wherein both the first sub-pixel and the third sub-pixel are disposed in a first side of the data line, and the second sub-pixel is disposed in a second side of the data line.

7. The pixel unit according to claim 6, wherein the first sub-pixel, the second sub-pixel and the third sub-pixel substantially have a same shape.

8. The pixel unit according to claim 6, wherein a third sub-pixel of another adjacent pixel unit is disposed between the first sub-pixel and the data line.

9. The pixel unit according to claim 6, wherein the first sub-pixel and the data line are closely disposed, the first sub-pixel and the second sub-pixel substantially have a same shape, and the third sub-pixel has a shape different from the shape of both the first sub-pixel and the second sub-pixel.

10. The pixel unit according to claim 5, wherein the first sub-pixel, the second sub-pixel and the third sub-pixel are disposed in a first side of the data line.

11. The pixel unit according to claim 10, wherein the first sub-pixel, the second sub-pixel and the third sub-pixel substantially have a same shape.

12. The pixel unit according to claim 1, further comprising:
   a first patterned storage electrode, substantially surrounding the first sub-pixel;
   a second patterned storage electrode, substantially surrounding the second sub-pixel; and
   a third patterned storage electrode, substantially surrounding the third sub-pixel.

13. A pixel array, adapted to a display panel, the pixel array comprising:
   a plurality of first gate lines;
   a plurality of second gate lines, wherein the first gate lines and the second gate lines are alternately arranged in sequence;
   a data line, intersecting the first gate lines and the second gate lines; and
   a plurality of first sub-pixels, a plurality of second sub-pixels and a plurality of third sub-pixels, arranged and constituting a plurality of row sub-pixels, each of the row sub-pixels comprising a first sub-pixel, a second sub-pixel and a third sub-pixel, wherein
      each of the first sub-pixels comprises a first pixel electrode and a first active switching device, wherein the first active switching device comprises a first gate electrode, a first source electrode and a first drain electrode, the first gate electrode is electrically connected to the corresponding second gate line, and the first drain electrode is electrically connected to the first pixel electrode,
      each of the second sub-pixels comprises a second pixel electrode and a second active switching device, wherein the second active switching device comprises a second gate electrode, a second source electrode and a second drain electrode, the second gate electrode is electrically connected to the corresponding second gate line, the second source electrode is electrically connected to the data line, and the second drain electrode is electrically connected to the second pixel electrode,
      each of the third sub-pixels comprises a third pixel electrode and a third active switching device, wherein the third active switching device comprises a third gate electrode, a third source electrode and a third drain electrode, the third gate electrode is electrically connected to the corresponding first gate line, the third source electrode is electrically connected to the data line, and the third drain electrode is electrically connected to the third pixel electrode and the first source electrode corresponding to the third drain electrode,
      wherein
         the first gate electrode of the first sub-pixel located in an (n+1)-th row of the row sub-pixels is electrically connected to an m-th of the second gate lines, the second gate electrode of the second sub-pixel located in the (n+1)-th row of the row sub-pixels is electrically connected to the m-th of the second gate lines, the third gate electrode of the third sub-pixel located in an n-th row of the row sub-pixels is electrically connected to an m-th of the first gate lines, and the third drain electrode of the third sub-pixel located in the n-th row of the row sub-pixels is electrically connected to the first source electrode of the first sub-pixel located in the (n+1)-th row of the row sub-pixels, and the third gate electrode of the third sub-pixel located in the (n+1)-th row of the row sub-pixels is electrically connected to an (m+1)-th of the first gate lines.

14. The pixel array according to claim 13, wherein both the first sub-pixel and the second sub-pixel located in the (n+1)-th row of the row sub-pixels and the third sub-pixel located in the n-th row of the row sub-pixels constitute a driving pixel unit, and the first sub-pixel, the second sub-pixel and the third sub-pixel arranged in a same row sub-pixel and adjacent to one another constitute a display pixel unit.

15. The pixel array according to claim 13, wherein the first sub-pixel, the second sub-pixel and the third sub-pixel of each of the row sub-pixels are disposed between the m-th of the second gate lines and the (m+1)-th of the first gate lines.

16. The pixel array according to claim 13, wherein the first gate line is configured to provide a first gate signal, the second gate line is configured to provide a second gate signal, the data line is configured to provide a data signal, and the data signal comprises a first data signal, a second data signal and a third data signal, wherein in a first period, the first gate signal has an "on" level and the second gate signal has an "on" level so that the first data signal is delivered to the first sub-pixel;

in a second period, the first gate signal has an "off" level and the second gate signal has an "on" level so that the second data signal is delivered to the second sub-pixel; and in a third period, the first gate signal has an "on" level and the second gate signal has an "off" level so that the third data signal is delivered to the third sub-pixel.

17. The pixel array according to claim 13, wherein both the first sub-pixel and the second sub-pixel located in the (n+1)-th row of the row sub-pixels are disposed in a same side of the second gate line, and both the first gate line and the second gate line are disposed between the third sub-pixel located in the n-th row of the row sub-pixels and both the first sub-pixel and the second sub-pixel located in the (n+1)-th row of the row sub-pixels.

18. The pixel array according to claim 17, wherein both the first sub-pixel and the third sub-pixel are disposed in a first side of the data line, and the second sub-pixel is disposed in a second side of the data line.

19. The pixel array according to claim 17, wherein the first sub-pixel and the data line are closely disposed, the first sub-pixel and the second sub-pixel substantially have a same shape, and the third sub-pixel has a shape different from the shape of both the first sub-pixel and the second sub-pixel.

20. The pixel array according to claim 17, wherein the first sub-pixel, the second sub-pixel and the third sub-pixel are disposed in a first side of the data line.

* * * * *